United States Patent

Daroux et al.

[11] Patent Number: 6,056,185
[45] Date of Patent: May 2, 2000

[54] METHOD OF CONNECTING BATTERIES TO ELECTRONIC CIRCUITS

[75] Inventors: Mark L. Daroux, Cleveland Heights; Robert Reichert, Euclid; John A. Centa, Concord Township; David A. Glover, Parma, all of Ohio; Shiuh-Kao Chiang, Haworth, N.J.

[73] Assignee: GA-TEK Inc., Eastlake, Ohio

[21] Appl. No.: 09/271,957

[22] Filed: Mar. 18, 1999

Related U.S. Application Data

[60] Provisional application No. 60/078,417, Mar. 18, 1998.

[51] Int. Cl.⁷ .................................................. B23K 20/10
[52] U.S. Cl. ......................................................... 228/110.1
[58] Field of Search ................................. 228/110.1, 111, 228/212, 901, 234.1; 429/127; 29/623.1, 2

[56] References Cited

U.S. PATENT DOCUMENTS

| | | |
|---|---|---|
| 3,566,203 | 2/1971 | Maguire . |
| 3,717,842 | 2/1973 | Douglas, Jr. . |
| 3,909,300 | 9/1975 | Schenk, Jr. et al. ................... 429/158 |
| 4,422,494 | 12/1983 | Chafin et al. .............................. 164/80 |
| 4,545,119 | 10/1985 | Tanazawa . |
| 4,580,713 | 4/1986 | Sekibata et al. . |
| 4,860,433 | 8/1989 | Miura . |
| 4,860,445 | 8/1989 | Jones . |
| 4,893,742 | 1/1990 | Bullock . |
| 5,223,063 | 6/1993 | Yamazaki et al. . |
| 5,361,491 | 11/1994 | Oomachi et al. . |
| 5,378,560 | 1/1995 | Tomiyama ............................. 429/217 |
| 5,449,575 | 9/1995 | Moulton ................................. 429/179 |
| 5,658,688 | 8/1997 | Jolson .................................... 429/194 |
| 5,660,319 | 8/1997 | Falcone et al. . |
| 5,735,449 | 4/1998 | Magni . |
| 5,908,151 | 6/1999 | Elias ..................................... 228/110.1 |

*Primary Examiner*—Samuel M. Heinrich
*Attorney, Agent, or Firm*—Mark Kusner; Michael A. Centanni

[57] ABSTRACT

A method of securing a metal lead of a polymer battery to a flexible circuit, comprising the steps of positioning a metal lead of a polymer electrolyte battery onto a connection pad of a circuit; clamping the metal lead and the connection pad between two weld fixtures of an ultrasonic welder; compressing the metal lead and connection pad between the two weld fixtures to establish a pressure of about 44.9 psi to about 30.8 psi; and vibrating the weld fixtures at a frequency of about 20 kHz for about 0.1 seconds to about 2.0 seconds.

1 Claim, No Drawings

METHOD OF CONNECTING BATTERIES TO ELECTRONIC CIRCUITS

This application claims the benefit of U.S. Provisional Application No. 60/078,417 filed on Mar. 18, 1998.

FIELD OF THE INVENTION

The present invention relates generally to methods of connecting batteries to electronic components, and more particularly, to a method of connecting the leads of a polymer electrolyte cell or battery to an electronic circuit.

BACKGROUND OF THE INVENTION

Improvements in microelectronics have increased the demand for electrolyte cells that can be directly incorporated into electronic devices so as to produce a portable, self-contained product. Some of these products are designed such that the electrolyte cell may be attached directly to an electronic circuit within the product. The battery leads are generally connected to copper current collector pads by conventional techniques, such as resistance welding or soldering. The electronic contact leads of polymeric batteries, especially Li-ion polymer batteries, are often formed of copper or aluminum. As will be appreciated, making such connections by welding or soldering becomes more difficult if the connection to be made is near electronic components within the device. Sometimes an additional component and/or manufacturing step, such as plating the leads with a more compatible metal such as nickel or stainless steel or inserting a bridging contact piece, is required.

The present invention provides an improved method for connecting copper or aluminum leads of a battery to a connector of a circuit or component.

SUMMARY OF THE INVENTION

In accordance with the present invention, there is provided a method of securing a metal lead of a battery, and especially a Li-ion battery, to a flexible circuit, comprising the steps of:

positioning a metal lead of a cell or battery onto a connection pad of a circuit;

clamping the metal lead and the connection pad between two weld fixtures of an ultrasonic welder, the weld fixture applying a pressure of about 44.9 psi to about 30.8 psi; and vibrating the weld fixtures at an ultrasonic frequency of about 10–60 kHz, and preferably 20 kHz for about 0.1 seconds to 2.0 seconds.

It is an object of the present invention to provide a method for attaching current collector leads of electrochemical cells or batteries, especially Li-ion batteries, and most especially Li-ion-polymer batteries, to a connector pad of an electronic circuit, particularly a flexible circuit (as opposed to a rigid printed circuit board).

Another object of the present invention is to provide a method as defined above for securing copper or aluminum leads to a copper connector pad.

Another object of the present invention is to provide a method as described above that does not require special coating or plating steps.

A still further object of the present invention is to provide a method as described above that does not require a filler material.

A still further object of the present invention is to provide a method as described above that utilizes ultrasonic welding to join current collector leads to a connector pad.

A still further object of the present invention is to provide a method as described above that provides a convenient method for automated battery connections and circuit attachment, particularly during the assembly of battery packs, and particularly where multiple cells or batteries are contained in one pack.

These and other objects and advantages will become apparent from the following description of a preferred embodiment of the invention.

DETAILED DESCRIPTION OF PREFERRED EMBODIMENT

Broadly stated, the present invention relates to a method of attaching a battery lead to a connector pad of an electronic circuit. More specifically, the invention relates to attaching a generally flat lead of a polymer electrolyte cell to a copper coated polymer strip commonly used to fabricate flexible circuitry. The present invention is particularly applicable to a lithium ion-liquid or a lithium ion-polymer battery that requires control and protection circuitry built into the battery pack. Such batteries typically include copper or aluminum current collectors. The current collectors are often in the form of a thin strip of metal that extends from the battery.

In accordance with the present invention, the flat leads of the current collectors of a polymer electrolyte cell are attached to connector pads on a flexible circuit by an ultrasonic welding technique. As used herein, the term "flexible circuit" refers to a copper circuit on a polymer film.

According to the present invention, the flat planar leads of the cell are positioned to overlie the connector pads of the flexible circuit. The overlying lead and connector pad are clamped between weld plates of an ultrasonic welder. The weld pads are vibrated at a predetermined frequency for a predetermined period of time to effect an ultrasonic weld between the copper or aluminum leads of the cell and the copper connector pad of the flexible circuit. During the ultrasonic welding, a predetermined pressure is exerted on the overlaying lead and connector pad. In accordance with the present invention, a pressure of about 44.9 psi to about 30.8 psi is maintained.

The foregoing process provides a strong, durable electrical connection between the copper or aluminum leads of the polymer electrolyte cell and the connector pads of the flexible circuit. The following tables show the preferred methods of connecting an aluminum or a copper current collector to a flexible circuit.

Table I shows the operating parameters for connecting copper foil to a copper-coated polymer. An AMTECH welder is used to connect 1-ounce copper foil to a flexible circuit having 1-ounce copper foil thereon. The settings of the welder are as follows:

TABLE I

Copper Foil to Copper-Coated Polymer

| | |
|---|---|
| Energy | 212 joules |
| Force | 10.3 psi |
| Pressure | 44.9 psi |
| Amplitude | 22 microns |
| Time | 5.00/0.001 seconds |
| Power | 2400/0 watts |
| Preheight | 9.99/0.50 mm |
| Height | 9.99/0 mm |

The following table shows the operating parameters of the same AMTECH welder when used to attach an aluminum foil to a copper clad polymer sheet to connect 1-ounce aluminum foil to a copper-coated polymer sheet having 1-ounce copper thereon. The following settings are used:

TABLE II

| Aluminum Foil to Copper-Coated Polymer | |
| --- | --- |
| Energy | 124 joules |
| Force | 11.0 psi |
| Pressure | 30.8 psi |
| Amplitude | 18 microns |
| Time | 5.00/0.01 seconds |
| Power | 2400/0 watts |
| Preheight | 9.99/0.50 mm |
| Height | 9.99/0 mm |

The foregoing procedures successfully welded the respective metal foils to a copper clad kapton film.

The present invention has been described with respect to a preferred method. Modifications and alterations to the method will become apparent to those skilled in the art upon a reading of the specification. For example, the ease of welding may be enhanced, or the severity of the welding conditions required reduced, if one or both of the surfaces to be welded are chemically and/or mechanically treated to clean, degrease, mechanically roughen the surface, or any combination thereof.

Welding conditions can be readily changed to accommodate difference thicknesses of leads, different gauges of pad material, different weld areas, etc. For example, pressures may be reduced to 1 psi or increased to 500 psi, and weld times may be as short as a fraction of a millisecond or as long as a minute, or pulsed. It is intended that all such modifications and alterations be included insofar as they come within the scope of the patent as claimed, or the equivalents thereof.

What is claimed is:

1. A method of securing a metal lead of a polymer battery to a flexible circuit, comprising the steps of:

positioning a metal lead of a polymer electrolyte battery onto a connection pad of a circuit;

clamping said metal lead and said connection pad between two weld fixtures of an ultrasonic welder;

compressing the metal lead and connection pad between said two weld fixtures to establish a pressure of about 44.9 psi to about 30.8 psi; and vibrating said weld fixtures at a frequency of about 20 kHz–40 kHz for about 0.1 seconds to about 2.0 seconds.

* * * * *